United States Patent
Kriz et al.

(10) Patent No.: US 9,064,875 B2
(45) Date of Patent: Jun. 23, 2015

(54) SEMICONDUCTOR STRUCTURE AND METHOD FOR MAKING SAME

(75) Inventors: Jakob Kriz, Weinboehla (DE); Norbert Urbansky, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/300,692

(22) Filed: Nov. 21, 2011

(65) Prior Publication Data
US 2012/0112350 A1    May 10, 2012

Related U.S. Application Data

(63) Continuation-in-part of application No. 12/892,947, filed on Sep. 29, 2010.

(51) Int. Cl.
*H01L 21/4763* (2006.01)
*H01L 23/532* (2006.01)
(Continued)

(52) U.S. Cl.
CPC .... *H01L 23/53223* (2013.01); *H01L 21/76843* (2013.01); *H01L 21/76856* (2013.01); *H01L 21/76864* (2013.01); *H01L 21/76873* (2013.01); *H01L 23/53238* (2013.01); *H01L 23/53252* (2013.01); *H01L 23/53295* (2013.01); *H01L 24/03* (2013.01); *H01L 24/05* (2013.01); *H01L 2224/03462* (2013.01); *H01L 2224/03848* (2013.01); *H01L 2224/0391* (2013.01); *H01L 2224/05557* (2013.01); *H01L 2224/05567* (2013.01); *H01L 2224/05573* (2013.01); *H01L 2224/05647* (2013.01); *H01L 2924/01012* (2013.01); *H01L 2924/01013* (2013.01); *H01L 2924/01029* (2013.01); *H01L 2924/0103* (2013.01); *H01L 2924/01079* (2013.01);

(Continued)

(58) Field of Classification Search
CPC .............. H01L 21/76843; H01L 21/76864; H01L 21/76873; H01L 23/53223; H01L 23/53238; H01L 23/53252; H01L 23/53295; H01L 24/03; H01L 24/05; H01L 21/76856; H01L 2924/01074; H01L 2224/03462; H01L 2224/05557; H01L 2224/05567; H01L 2224/05573; H01L 2224/05647; H01L 2924/01012; H01L 2924/01013; H01L 2924/01029; H01L 2924/0103; H01L 2924/01079; H01L 2924/01047
See application file for complete search history.

(56) References Cited

U.S. PATENT DOCUMENTS 6,153,521 A * 11/2000 Cheung et al. ................ 438/687
6,218,732 B1    4/2001 Russell et al.
(Continued)

FOREIGN PATENT DOCUMENTS

CN    102005417    4/2011
JP    2009016782    * 1/2009

OTHER PUBLICATIONS

The machine translation of Matsumoto et al. (JP 2009-016782).*
(Continued)

*Primary Examiner* — Yasser A Abdelaziez
(74) *Attorney, Agent, or Firm* — Philip Schlazer (57) ABSTRACT

Embodiments relate to a method for making a semiconductor structure, the method comprising: forming a seed layer in direct contact with a dielectric material; forming a masking layer over the seed layer; patterning the masking layer to expose the seed layer; forming a fill layer over the exposed seed layer; and causing the seed layer to react with the dielectric layer to form a barrier layer between the fill layer and the dielectric layer.

38 Claims, 10 Drawing Sheets

(51) Int. Cl.
*H01L 21/768* (2006.01)
*H01L 23/00* (2006.01)

(52) U.S. Cl.
CPC ............. *H01L2924/01006* (2013.01); *H01L 2924/01023* (2013.01); *H01L 2924/01024* (2013.01); *H01L 2924/01033* (2013.01); *H01L 2924/01047* (2013.01); *H01L 2924/0105* (2013.01); *H01L 2924/01074* (2013.01); *H01L 2924/00014* (2013.01)

(56) References Cited

U.S. PATENT DOCUMENTS

| | | | |
|---|---|---|---|
| 6,841,478 | B2 | 1/2005 | McTeer |
| 7,207,096 | B2 | 4/2007 | Gambino et al. |
| 2005/0218519 | A1 | 10/2005 | Koike et al. |
| 2008/0157362 | A1 | 7/2008 | Chang et al. |
| 2008/0237859 | A1* | 10/2008 | Ishizaka et al. ............ 257/751 |
| 2008/0311739 | A1 | 12/2008 | Besling et al. |
| 2009/0127710 | A1 | 5/2009 | Daubenspeck et al. |
| 2009/0209099 | A1 | 8/2009 | Yu et al. |
| 2010/0140802 | A1* | 6/2010 | Matsumoto et al. ......... 257/741 |
| 2011/0049705 | A1 | 3/2011 | Liu et al. |
| 2012/0074573 | A1 | 3/2012 | Dallmann |

OTHER PUBLICATIONS

Takamasa Usi et al., "Highly Reliable Copper Dual-Damascene Interconnects With Self-Formed MnSixOy Barrier Layer" IEEE Transactions on Electron Devices, vol. 53, No. 10, Oct. 2006, pp. 2492-2499.

Office Action issued for CN 2012/10474509.0 dated Jan. 12, 2015, State Intellectual Property Office, P. R. China (w/English translation).

* cited by examiner

SEMICONDUCTOR STRUCTURE AND METHOD FOR MAKING SAME

RELATED APPLICATION INFORMATION

The present patent application is a continuation-in-part of U.S. patent application Ser. No. 12/892,947, filed on Sep. 29, 2010.

TECHNICAL FIELD

Embodiments of the invention relate generally to semiconductor structures and methods for making semiconductor structures.

BACKGROUND

Semiconductor devices utilize conductive bond pads. New ways of making bond pads are needed.

BRIEF DESCRIPTION OF THE DRAWINGS

FIGS. 1 through 13B shows methods of making semiconductor structure in accordance with embodiments of the present invention.

DETAILED DESCRIPTION

The making and using of embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
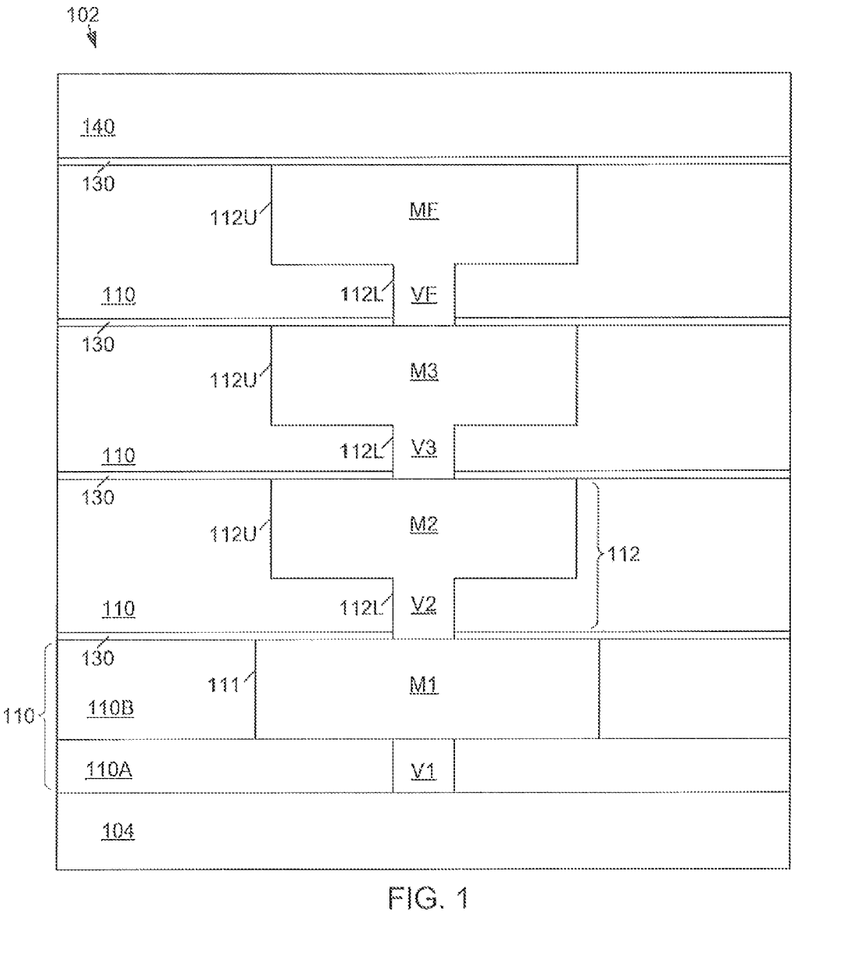

FIG. 1 shows a semiconductor structure 102 which is an embodiment of the present invention. Semiconductor structure 102 includes a substrate 104. The substrate 104 may be a semiconductor substrate. The semiconductor substrate may be a silicon substrate. The semiconductor substrate may be a silicon carbide substrate. The semiconductor substrate may be a gallium nitride substrate. The semiconductor substrate may include an epitaxial layer or may be formed without an epitaxial layer. The semiconductor substrate may be a bulk substrate or may be a semiconductor-on-insulator substrate.

The semiconductor structure 102 further includes one or more metallization levels M1 . . . MF. The semiconductor structure 102 may include a plurality of metallization levels. Metallization level M1 is the first metallization level, metallization level M2 is the second metallization level, metallization level M3 is the third metallization level while metallization level MF is the final metallization level.

Each of the metallization levels M1 . . . MF may be formed within an interlevel dielectric layer 110. A conductive, via V1 . . . VF electrically couples one of the metallization levels another of the metallization levels or electrically couples a metallization level M1 to the substrate 104. A conductive via that electrically couples the first metallization level M1 to the substrate 104 may also be referred to as a conductive contact.

In the embodiment shown in FIG. 1, the metallization level M2 and the conductive via V2 may be formed at the same time by a dual damascene process in a dual-tier opening 112. Likewise, this is also the case for metallization level M3 and conductive via V3 as well as metallization level MF and conductive via VF. A dual-tier opening may have an Upper portion 112U (e.g. in the form of a trench) and a lower portion 112L (e.g. in the form of a hole). In another embodiment, one or more of the metallization levels M2 through MF may be formed by a single damascene process single-tier openings.

In the embodiment shown, the metallization level M1 may be formed by a single damascene process in a single-tie opening 111. In another embodiment, the metallization level M1 may be formed by a dual damascene process at the same time as the conductive via V1.

The metallization levels M1 through. MF may comprise conductive material such as a metallic material. The metallic material may comprise a metallic element such as Cu (copper). The Cu may be in the form of pure copper and/or copper alloy. The conductive vias V1 through VF may comprise the same conductive material as the metallization levels or they may comprise a different conductive material. For example, the conductive via V1 may comprise the element W (tungsten) which may be in the form of pure tungsten and/or tungsten alloy. It is understood that any pure metal may include trace impurities.

In the embodiment shown, the metallization level M1 may be formed by a single damascene process. In another embodiment, the metallization level M1 and conductive via V1 may be formed by a dual damascene process.

In the embodiment shown in FIG. 1, a barrier layer 130 may be formed over an interlevel dielectric layer 110 and over the metallization level M1 through MF. The barrier layer 130 may, for example, comprise a dielectric material. In one or more embodiments, the dielectric material of the barrier layer 130 may be different from the dielectric material of the interlevel dielectric layer 110. The barrier layer 130 may, for example, comprise a nitride such as silicon nitride. The barrier layer 130 may prevent the material in a metallization level from entering the next higher interlevel dielectric layer.

Still referring to FIG. 1, a barrier layer 130 may be formed over the interlevel 110 as well as over the final metallization level MF. A dielectric layer 140 may be formed over the barrier layer 130. The dielectric layer 140 may comprise an oxide such as a silicon oxide. The dielectric material of the dielectric layer 140 may be different from the dielectric material of barrier layer 130.

Figure 2:
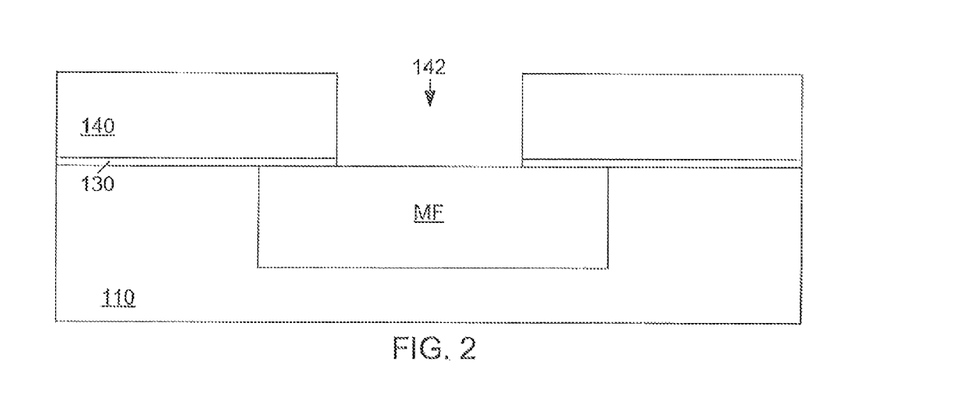

Referring now to FIG. 2, an opening 142 is formed in (or through) the dielectric layer 140 as well as in (or through) the barrier layer 130 so as to expose the final metallization level MF. The opening 142 may be formed by first forming a masking layer over the dielectric layer 140 and patterning the masking layer. The opening 142 may then be formed by etching the layer 140 and 130. The etching process may be a dry etching process. The masking layer may include a resist layer such as a photoresist layer.

It is noted that FIG. 2 as well as the remaining figures show only the final metallization level MF embedded in the interlevel dielectric layer 110. However, is understood that other metallization levels as well as conductive vias as well as a substrate may also exist.

Figure 3:
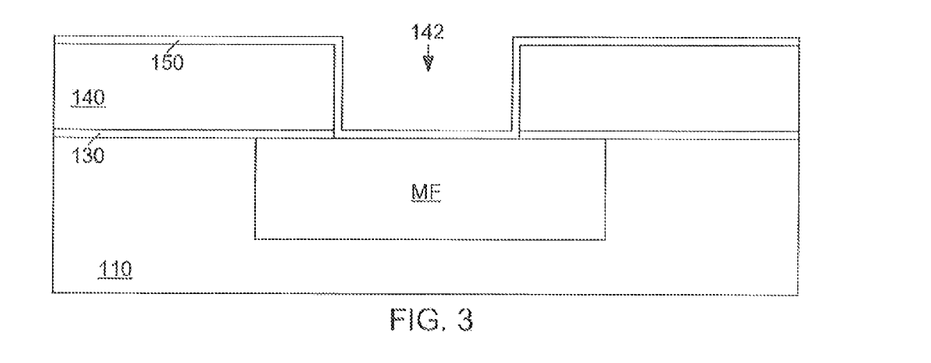

Referring to FIG. 3, a seed layer 150 may be formed over the dielectric layer 140 as well as within the opening 142 (for example, over the sidewall and bottom surfaces of the opening 142). The seed layer may be formed by a deposition process. The deposition process of the seed layer 150 may be a conformal deposition process. The seed layer may be formed, for example, by a sputtering process. The seed layer may be formed, for example, by a physical vapor deposition process.

The seed layer 150 may be a conductive layer. The seed layer may be a metallic layer. The seed layer may comprise a metallic material. The seed layer may comprise a pure metal and/or an alloy and/or a compound. In one or more embodiments, the seed layer may comprise an alloy. In one or more embodiments, an alloy may comprise at least two metallic elements. In one or more embodiments, an alloy may comprise at least one metallic element and at least one non-metallic element (for example, steel). It is understood that any pure metal may include trace impurities.

In one or more embodiments, an alloy may be a binary alloy. In one or more embodiments, an alloy may be a ternary alloy. In one or more embodiments, an alloy may comprise more than three elements.

The seed layer may comprise (or may consist essentially of) at lease one base element BASE and at least one additional element ADD. In one or more embodiments, the base element BASE may be any metallic element. In an embodiment, the base element BASE may be Cu (copper). Hence, in one or more embodiments, the seed layer may comprise Cu and at least one additional element ADD. In one or more embodiments, the base element BASE may be Au (gold). In one or more embodiments, the base element BASE may be Ag (silver). In one or more embodiments, the base element BASE may be Al (aluminum). The additional elements ADD may for example, include one or more elements selected from the group consisting of Mn (manganese), Mg (magnesium), Al (aluminum), Ti (titanium), V (vanadium), Cr (chromium), Sn (tin), Zn (zinc), Fe (iron), and Ag (silver). In one or more embodiments, the one or more addition elements may include (or may be) Mn (manganese).

The seed layer may comprise (or may consist essentially of) an alloy. The alloy may comprise (or may consist essentially of) a base element BASE and at least one additional element ADD. In one or more embodiments, the base element BASE may be any metallic element. In an embodiment, the base element BASE may be Cu (copper). Hence, in one or more embodiments, the alloy may comprise Cu and at least one additional element ADD. In one or more embodiments, the base element BASE may be Au (gold). In one or more embodiments, the base element BASE may be Ag (silver). In one or more embodiments, the base element BASE may be Al (aluminum). In one or more embodiments, the additional elements ADD may for example, include one or more elements selected from the group consisting of Mn (manganese), Mg (magnesium), Al (aluminum), Ti (titanium), V (vanadium), Cr (chromium), Sn (tin), Zn (zinc), Fe (iron), and Ag (silver). In one or more embodiments, the one or more addition elements may include (or may be) Mn (manganese). In one or more embodiments, the amount of the base element BASE may be lees than or equal to about 10 atomic percent. In an embodiment, the amount of the BASE element may be less than or equal to about 5 atomic percent. In an embodiment, the amount of the base element BASE may be less than or equal to about 3 atomic percent. In an embodiment, the amount of the base element BASE be less than or equal to about 2 atomic percent.

In an embodiment, the seed layer may comprise (or may consist essentially of) a copper alloy. The copper alloy may comprise the element Cu as well as one or more additional elements ADD. The additional elements ADD may for example, be one or more elements selected from the group consisting of Mn (manganese), Mg (magnesium), Al (aluminum), Ti (titanium), V (vanadium), Cr (chromium), Sn (zinc), Fe (iron), and Ag (silver). In one or more embodiments, the additional elements ADD may include Mn. In one or more embodiments, the additional element may be Mn. In an embodiment, the copper alloy may comprise the elements Cu and Mn. In one or more embodiments, the copper alloy may consist essentially of the elements Cu and Mn. The copper alloy may be a CuMn alloy. In an embodiment, the amount of Cu may be less than or equal to about 10 atomic percent. In an embodiment, the amount of Cu may be less than or equal to about 5 atomic percent. In an embodiment, the amount of Cu may be less than or equal to about 3 atomic percent. In an embodiment, the amount of Cu may be less than or equal to about 2 atomic percent.

The seed layer may comprise (or may consist essentially of) a compound. The compound may comprise (or may consist essentially of) a base element BASE and at least one additional element ADD. In one or more embodiments, the base element BASE may be any metallic element. In an embodiment, the base element BASE may be Cu (copper). Hence, in one or more embodiments, the compound may comprise Cu and at least one additional element ADD. In one or more embodiments, the base element BASE may be Au (gold). In one or more embodiments, the base element BASE may be Ag (silver). In one or more embodiments, the base element BASE may be Al (aluminum). In one or more embodiments, the additional elements ADD may for example, include one or more elements selected from the group consisting of Mn (manganese), Mg (magnesium), Al (aluminum), Ti (titanium), V (vanadium), Cr (chromium), Sn (tin), Zn (zinc), Fe (iron), and Ag (silver). In one or more embodiments, the one or more addition elements may include (or may be) Mn (manganese).

Figure 4:
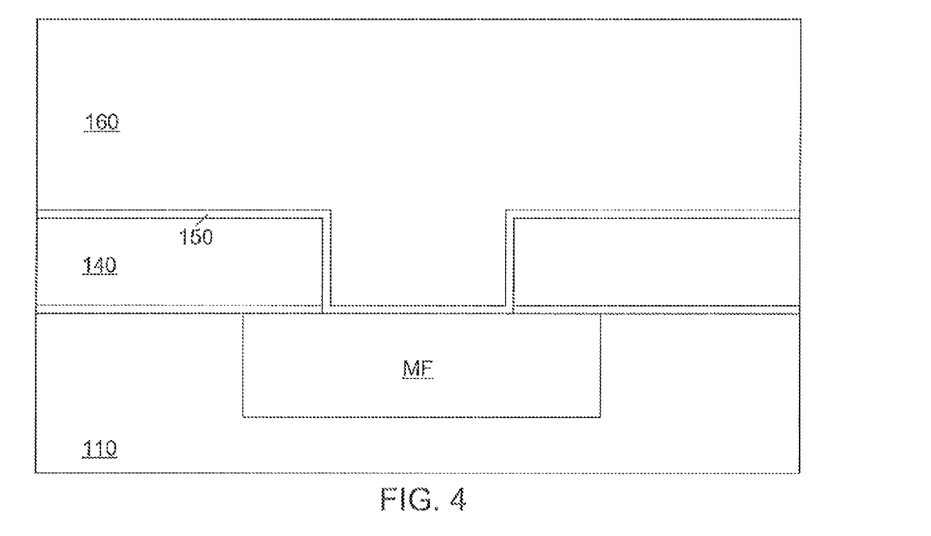

Referring to FIG. 4, after the formation of the seed layer 150, a masking layer 160 may be formed over (for example, directly onto) the seed layer 150. The masking layer 160 may comprise a resist layer (for example, a photoresist layer).

Figure 5:
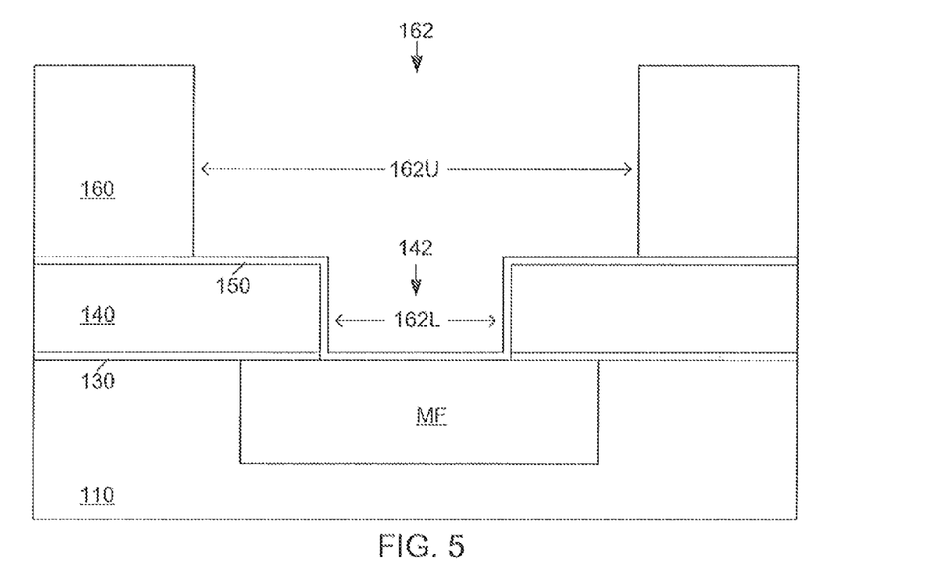

Referring to FIG. 5, the masking layer 160 may be patterned so as to form an opening 162 in (or through) the masking layer 160. The opening 162 may expose the seed layer 150. An exposed portion of the seed layer 162 may be within the opening 142.

The opening 162 may include an upper portion 162U as well as a lower portion 162L. The upper portion 162U may itself be viewed as an opening 162U. The upper portion. 162U may be a trench or a hole. The lower portion 162L may itself be viewed as an opening 162L. The lower portion may be a trench or a hole. In an embodiment, the upper portion 162U may be a trench while the lower portion 162L may be a hole.

In an embodiment, the lower portion 162L may correspond to the opening 142. In an embodiment, the lower portion 162L may be within the opening 142 (as shown in FIG. 2). In an embodiment, the opening 162 may include at least a portion of the opening 142 (as shown in FIG. 2). In an embodiment, the upper portion 162U may overlie the lower portion 162L. In an embodiment, the upper portion 162U may be wider than the lower portion 162L. In an embodiment, the upper portion 162U may overlie the opening 142. In one or more embodiments, the upper portion 162U may be wider than the opening 142 (as shown in FIG. 2).

In an embodiment, the opening 162 may expose a portion of the seed layer 150. The seed layer 150 may be exposed along the bottom of the opening 162U. The seed layer 150 may be exposed within the opening 162L. In particular, the seed 150 may be exposed along the sidewall of opening 162L. Also, the seed layer 150 may be exposed along the bottom of opening 162L.

Figure 6:
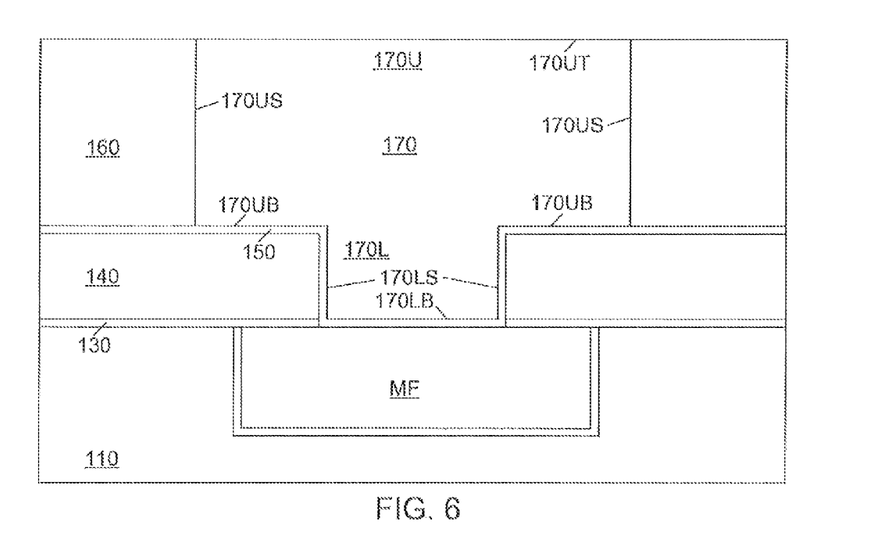

Referring to FIG. 6, a fill layer 170 may then be formed within the opening 162. The fill layer may be formed over (for example, directly in contact with) the seed layer 150 that is exposed within the opening 162. The fill layer may be formed within the lower portion 162L (e.g. opening 162L) and the upper portion 162U (e.g. opening 162U) of the opening 162. The fill layer 170 may be formed by a pattern plating process.

The fill layer 170 may be formed by an electrodeposition process. In one or more embodiments, the fill layer 170 may comprise any material that can be electrodeposited. In one or more embodiments, the fill layer 170 may comprise a conductive material. In one or more embodiments, the fill layer 170 may comprise a metallic material. In one or more embodiments, the fill layer 170 may comprise a pure metal and/or an alloy. In one or more embodiments, the fill layer 170 may comprise the element Cu (copper). In one or more, embodiments, the fill layer 170 may comprise pure copper and/or a copper alloy. In one or more embodiments, the fill layer 170 may comprise a mixture of pure copper and a copper alloy. In one or more embodiments, the fill layer 170 may consist essentially of pure copper and/or copper alloy. In one or more embodiments, the fill layer 170 may consist essentially of pure copper. In one or more embodiments, the fill layer 170 may consist essentially of copper alloy.

In the embodiment shown in FIG. 6, the fill layer 170 may form a dual-tier structure having an upper portion 170U as well as a lower portion 170L. The upper portion 170U is formed in the upper opening 162U while the lower portion 162L is formed in the lower opening 162L. The fill layer 170 may be formed by a pattern plating process (for example, an electrodeposition process) in the opening 162.

In an embodiment, the upper portion 170U may be formed by the same electrodeposition process as the lower portion 170L. In an embodiment, the upper portion 170U may be formed at the same time as the lower portion 170L.

The fill layer 170 includes an upper portion 170U and a lower portion 170L. The upper portion 170U includes a top surface 170UT which, in this case, corresponds to the top surface of the fill layer 170. The upper portion also includes at least one sidewall surface 170US and a bottom surface 170UB. The lower portion 170L includes at least one sidewall surface 170LS as well as a bottom surface 170LB. The bottom surface 170LB corresponds, in this case, to the bottom surface of the fill layer 170.

Figure 7:
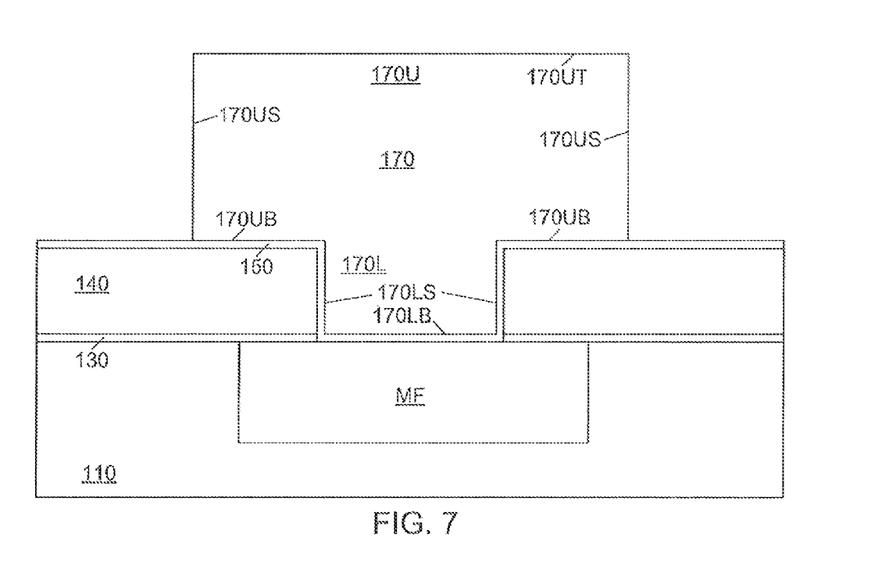

Referring to FIG. 7, the masking layer 160 may then be removed.

Figure 8:
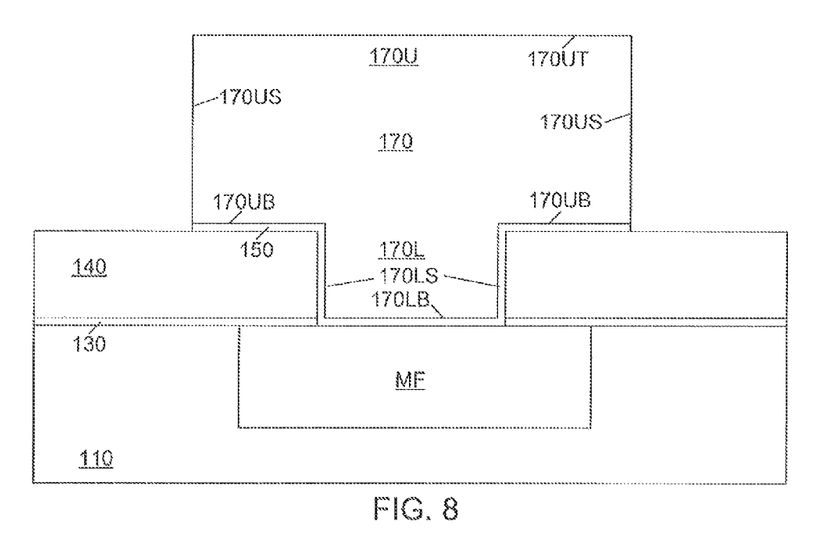

Referring to FIG. 8, the exposed portion of the seed layer 150 may be removed. For example, that portion of the seed layer 10 which does not underlie the fill layer 170 may be removed. This may be done by an etch process. In an embodiment, the etch process may include a wet etch process. In an embodiment, the etch process may include a dry etch process.

Figure 9A:
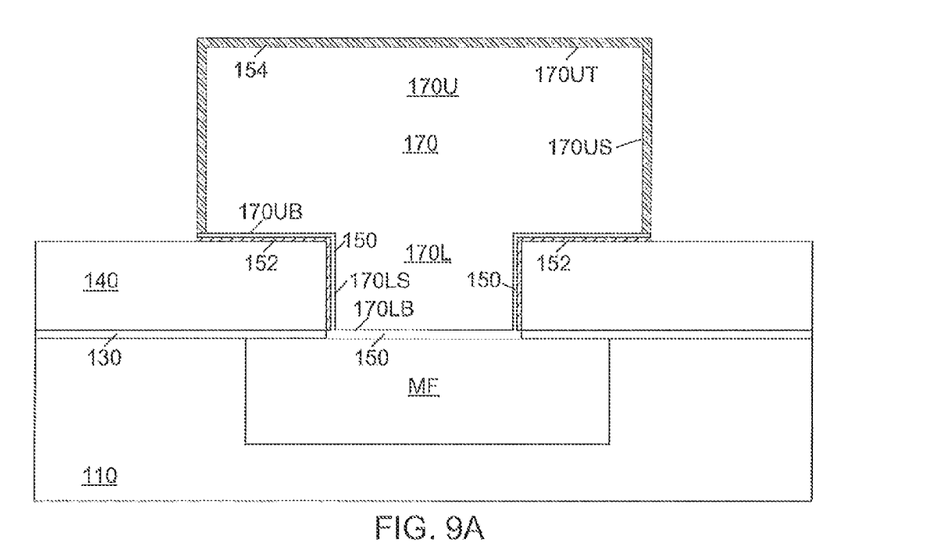

Referring to FIG. 9A, at least one thermal anneal process may then be applied to the structure shown in FIG. 8. In an embodiment, the thermal anneal process may, for example, have a temperature of about 500° C. or less. In an embodiment, the thermal anneal process may, for example, have a temperature of about 450° C. or less. In an embodiment, the thermal anneal process may, for example, have a temperature of about 400° C. or less. In an embodiment, the thermal anneal process may, for example, have a temperature of about 300° C. or less. In an embodiment, the thermal anneal process may, for example, have a temperature of about 200° C. or less.

The thermal anneal process may, for example, have a temperature of about 200° C. or greater. The thermal anneal process may, for example, have a temperature of about 300° C. or greater. The thermal anneal process may, for example, have a temperature of about 400° C. or greater. The thermal anneal process may, for example, have a temperature of about 450° C. or greater. In an embodiment, the thermal anneal process may have a temperature of about 500° C. or greater.

In an embodiment, the thermal anneal process may have a time period of about 120 minutes or less. In an embodiment, the thermal anneal process may have a time period of about 60 minutes or less. In an embodiment, the thermal anneal process may have a time period of about 30 minutes or less. In an embodiment, the thermal anneal process may have a time period of about 20 minutes or less. In an embodiment, the thermal anneal process may have a time period of about 10 minutes or less.

In an embodiment, the thermal anneal process may have a time period of about 10 minutes or greater. In an embodiment, the thermal anneal process may have a time period of about 20 minutes or greater. In an embodiment, the thermal anneal process may have a time period of about 30 minutes or greater. In an embodiment, the thermal anneal process may have a time period of about 60 minutes or greater. In an embodiment, the thermal anneal process may have a time period of about 120 minutes or greater.

Referring to FIG. 9A, as a result of the thermal anneal process, the seed layer 150 (shown in FIG. 8) may react with the dielectric layer 140 to form a barrier layer 152. In the embodiments shown in FIG. 9A, a portion of the seed layer 150 may be remaining so that the barrier layer 152 may be between the dielectric layer 140 and the remaining portion of the seed layer 150. The barrier layer 152 may be a self-formed barrier layer. For example, it may be formed from the reaction between the barrier layer 140 and the seed layer 150.

In one or more embodiments, the seed layer 150 may comprise (or may consist essentially of) a copper-manganese alloy (e.g. CuMn alloy) while the dielectric layer 140 may comprise silicon dioxide $SiO_2$. As a result of the thermal anneal process, the two materials may react to form a barrier layer 152. For example, the Mn of the seed layer 150 may react with the silicon dioxide of the dielectric layer 140 to form a barrier layer 152 comprising (or consisting essentially of) $MnSi_xO_y$.

In one or more embodiments, the seed layer 150 may comprise one or more additional element ADD. For example, the seed layer 150 may comprise (or may consist essentially of) a BASE(ADD) alloy. The BASE(ADD) alloy may include a BASE element. The BASE element may, for example, be a metallic element such as, for example, Cu, Ag or Au. Hence, as an example, the seed layer may include (or may consist essentially of) a Cu(ADD) alloy such as a CuMn alloy. In one or more embodiments, as a result of the anneal process, one or more of (for example, all of) the additional elements ADD of the seed layer may react with the dielectric layer 140 so as to form a barrier layer 152. For example and the dielectric layer 140 may comprise (or may consist essentially of) silicon dioxide. The silicon dioxide of the of the dielectric layer 140 may react with one or more of the additional elements ADD to form a barrier layer 152 which may comprise an $(ADD)Si_xO_y$ material that may include one or more of the additional elements from the seed layer 150.

In one or more embodiments, the barrier layer 152 may comprise one or more of the additional elements ADD from the seed layer 150 as well as the elements Si (silicon) and O (oxygen) from the dielectric layer 140. In one or more embodiments, the barrier layer may consist essentially of the one or more of the additional elements ADD, the elements Si (silicon) and the element O (oxygen). In one or more embodiments, the barrier layer may include (or may consist essentially of) a compound. In one or more embodiments, the barrier layer may include (or may consist essentially of) a compound that comprises (or consists essentially of) one or more of the additional elements ADD, the element Si (silicon) and the element O (oxygen). As noted, in one or more embodiments, the one or more additional elements ADD may represent one or more elements selected from the group consisting of Mn (manganese), Mg (magnesium), Al (aluminum), Ti (titanium), V (vanadium), Cr (chromium), Sn (tin), Zn (zinc), Fe (iron), and Ag (silver). In one or more embodiments, the one or more additional elements ADD may include Mn. In one or more embodiments, the additional element ADD may be Mn.

In an embodiment, the barrier layer 152 may form so as to be in direct contact with the dielectric layer 140. Referring to FIG. 9A, it is seen that, in an embodiment, the portion of the seed layer 150 that does not contact the dielectric layer 140 may not react with the dielectric layer 140 may thus remain as a seed layer 150. This portion of seed layer 150 is shown as being between the final metal line MF and the bottom surface 170LB of the lower portion 170L (which, in this case, corresponds to the bottom surface of the fill layer 170). This portion of the seed layer 150 may contact the final metal line MF.

Referring to FIG. 9A, the barrier layer 152 may be between the dielectric layer 140 and another portion of the seed layer 150 that did not react with the dielectric layer 140. The barrier layer 152 may be in direct contact with the dielectric layer 140 and the seed layer 150. In the embodiment shown in FIG. 9A, the barrier layer 152 may form on the dielectric layer 140. In addition, the barrier layer 152 may be proximate the bottom surface 170UB of the upper portion 170U as well as proximate to the at least one sidewall surface 170LS of the lower portion 170L. Referring to FIG. 9A, it is seen that the barrier layer 152 may also between the dielectric layer 140 and the fill layer 170.

Figure 9B:
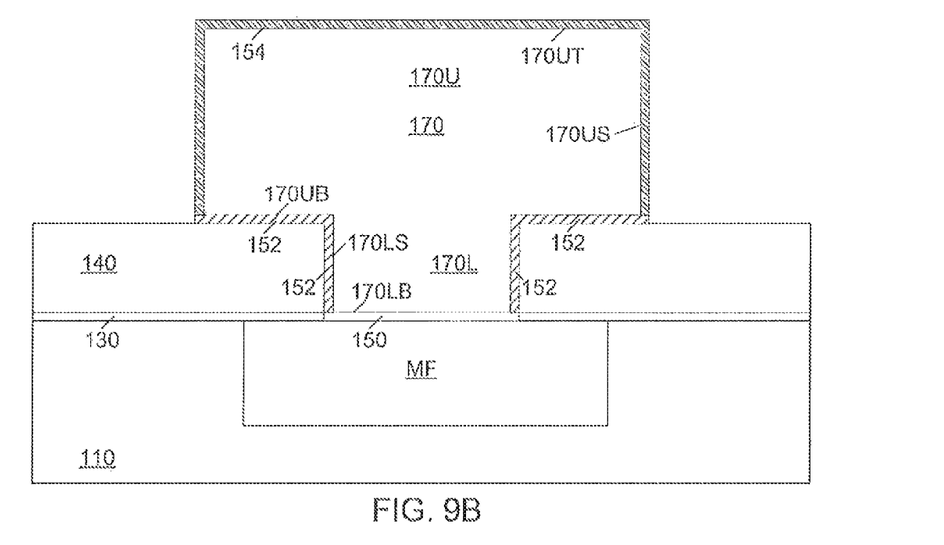

FIG. 9B shows another embodiment. Referring to FIG. 9B, after the barrier layer 152 is formed, it is possible that the portion of the seed layer 150 that was between the dielectric layer 140 and the fill layer 170 is all used up and is no longer present. In this case, it is possible that the barrier layer 152 may form between the dielectric layer 140 and the fill layer 170. The barrier layer 152 may be in direct contact with both the dielectric layer 140 and the fill layer 170. In the embodiment shown in FIG. 9B, the barrier layer 152 may be in direct contact with the bottom surface 170UB of the upper portion 170U as well as in direct contact with the at least one sidewall surface 170LS of the lower portion 170L. Referring to FIG. 9B, it is seen that the portion of the seed layer 150 that is between the final metal line MF and the bottom surface 170LB of the lower portion may not react and may still remain.

Referring to FIGS. 9A and 9B, in one or more embodiments, it is possible that the fill layer 170 comprise the element Cu (copper). The barrier layer 152 may form between the Cu (which may, for example, be in the form of pure copper and/or a copper alloy) and the dielectric layer 140.

It is additionally noted that, one or more of (for example, all of) the additional elements. ADD may migrate to the top surface 170UT of the upper portion 170U of fill layer 170 and to the one or more sidewall surfaces 170US of the upper portion 170U of the fill layer 170. This migration may be due, at least in part, to the at least one thermal anneal process described above. The one or mere additional elements ADD may come form the seed layer 150.

One or more of the additional elements ADD that migrate to top and sidewall surfaces of upper portion 170U may react with oxygen so as to form an oxide layer 154 which may comprise (or may consist essentially of) an oxide that includes O (oxygen) and one or more of (for example, all of) the additional elements ADD. This oxide may, for example, be a compound. The oxide may, for example be (ADD) $O_x$ (which may, for example, be a compound) where ADD represents one or more of (for example, all of) the additional elements. The oxide may form at the top surface 170UT and sidewall surfaces 170US of the upper portion 170U of the fill layer 170. The oxide may form on those surfaces of the fill layer 170 that are exposed to oxygen. In the case in which the additional elements may be Mn, then the oxide layer 154 may comprise (or may consist essentially of) $MnO_x$ (which may, for example be a compound). In an embodiment, the oxide layer 154 may be a metal oxide layer. In an embodiment, the layer 154 may be conductive. In an embodiment, the layer 154 may be metallic. In an embodiment, the layer 154 may be non-conductive. In one or more embodiments, the layer 154 may comprise the one or more additional elements ADD and the element O (oxygen). In one or more embodiments, the layer 154 may consist essentially of the one or more additional elements ADD and the element O (oxygen). In one or more embodiments, the layer 154 may include (or may consist essentially of) a compound. In one or more embodiments, the layer 154 may include (or may consist essentially of) a compound that comprises (or consists essentially of) one or more of (for example, all of) the additional elements ADD and the element O (oxygen). In one or more embodiments, the layer 154 may consist essentially of a compound that consists essentially of the one or more of (for example, all of) the additional elements ADD and the element O (oxygen).

In an embodiment, the layer 154 may be a passivation layer. In an embodiment, the layer 154 may include (or may be) dielectric layer. In an embodiment, the layer 154 include (or may be) an oxide layer. In an embodiment, the layer 154 may include (or may be) a metal oxide layer. In an embodiment, layer 154 may include (or may be) a conductive layer. In an embodiment, layer 154 may include (or may be) a metallic layer. In an embodiment, layer 154 may include (or may be) a non-conductive layer.

It is noted that the remaining discussion is directed to the embodiment shown in FIG. 9B. However, the discussion is also applicable to the embodiment shown in FIG. 9A.

Figure 10:
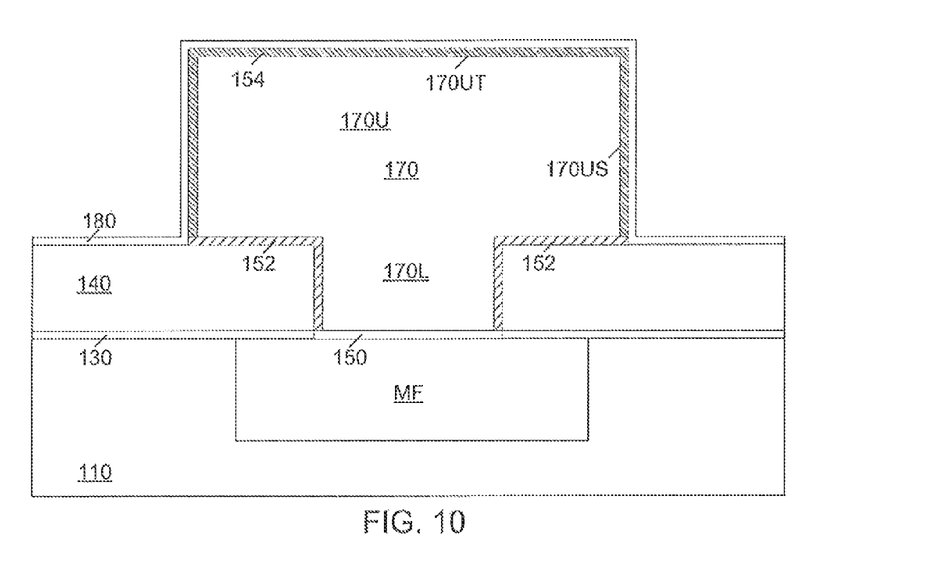

Referring to FIG. 10, a barrier layer 180 may be formed over the structure shown in FIG. 9B to form the structure shown in FIG. 10. The barrier layer 180 may be formed over the top surface 170UT and sidewall surfaces 170US of fill layer 170 as well as over at least a portion of the top surface of dielectric layer 140. The barrier layer 18 may comprise a dielectric material which is different from the dielectric layer 140 (e.g. a different composition). The barrier layer 180 may comprise a nitride such as silicon nitride. The barrier layer 180 may comprise silicon oxynitride. The barrier layer 180 may comprise silicon carbonitride. The barrier layer 180 may act as a diffusion barrier that prevents the diffusion of Cu out from the fill layer 170. In the embodiment shown in FIG. 10, it is seen that the barrier layer 180 may be formed over the layer 154. The barrier layer 180 may also be formed over a top surface of dielectric layer 140. In one or more embodiments, the barrier layer 180 may be in direct contact with the layer 154.

Figure 11:
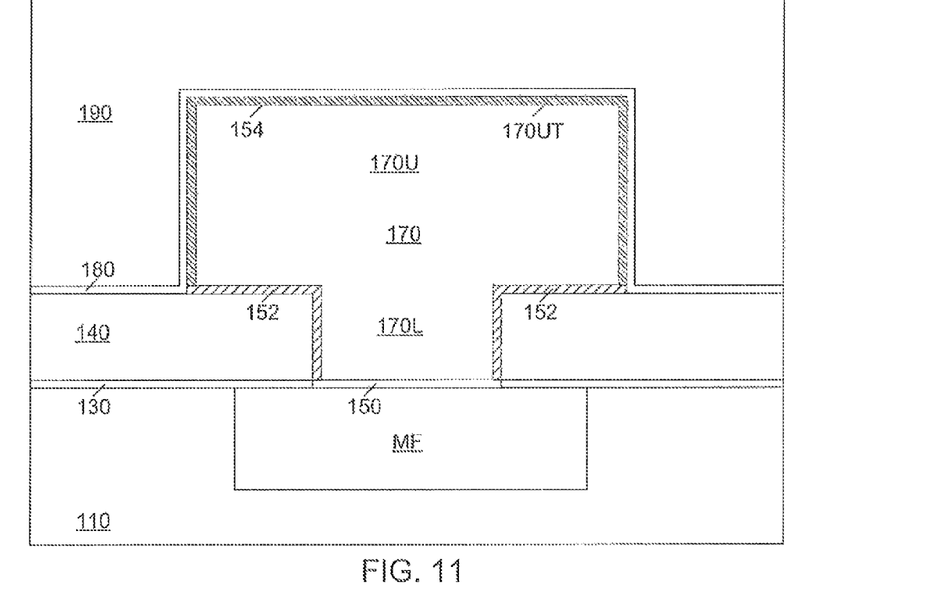

Referring to FIG. 11, a passivation layer 190 may be formed over the structure shown in FIG. 10 to form the structure shown in FIG. 11. Hence, the passivation layer 190 may be formed over the barrier layer 180. In an embodiment, the passivation layer may comprise (or may consist essentially of) a dielectric material. In one or more embodiments, the passivation layer may be a dielectric layer. In an embodiment, the dielectric material of the passivation layer may be different from that of the dielectric layer 140 (for example, a different composition). In an embodiment, the passivation layer 190 may comprise a polyimide. In an embodiment, the passivation layer 190 may comprise an oxide, a nitride or an oxynitride.

Figure 12:
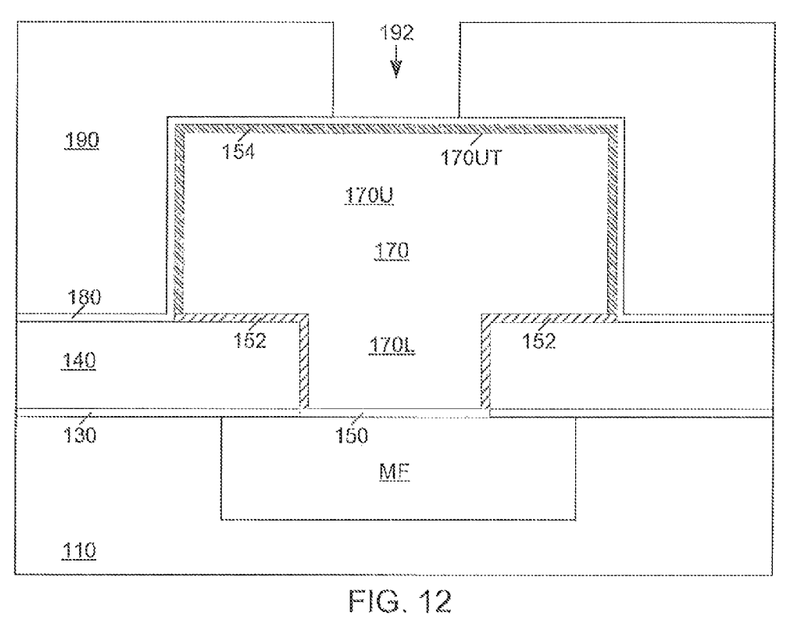
Figure 13A:
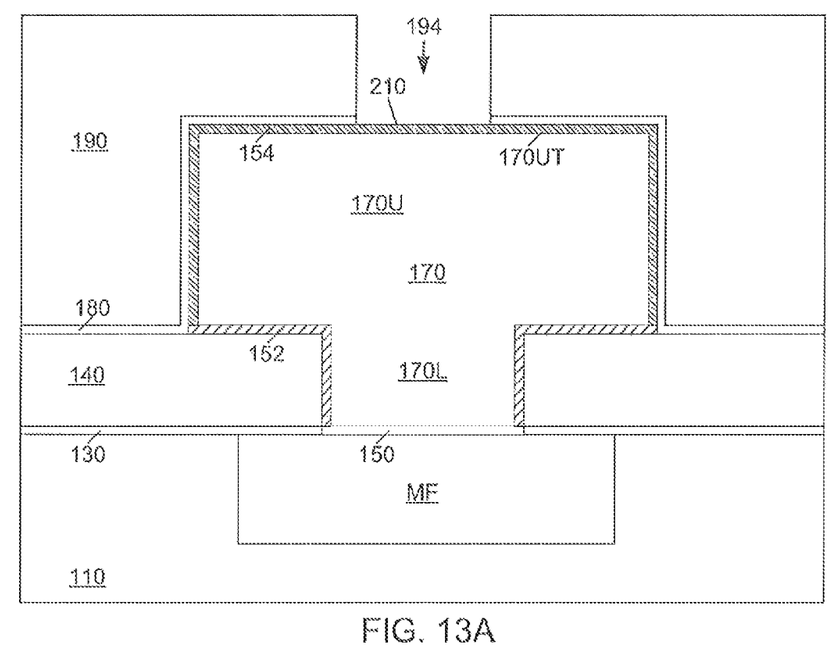

Referring to FIG. 12, an opening 192 may be formed in (or through) the passivation layer 190. Referring to FIG. 13A, the opening 192 may be continued as opening 194 that is also formed in (or through) the barrier layer 180. The opening 194 may expose a top surface of the layer 154. As noted above, in an embodiment, it is possible that the layer 154 is conductive. Hence, a bond pad surface 210 may be formed by exposing a top surface of the layer 154.

Figure 13B:
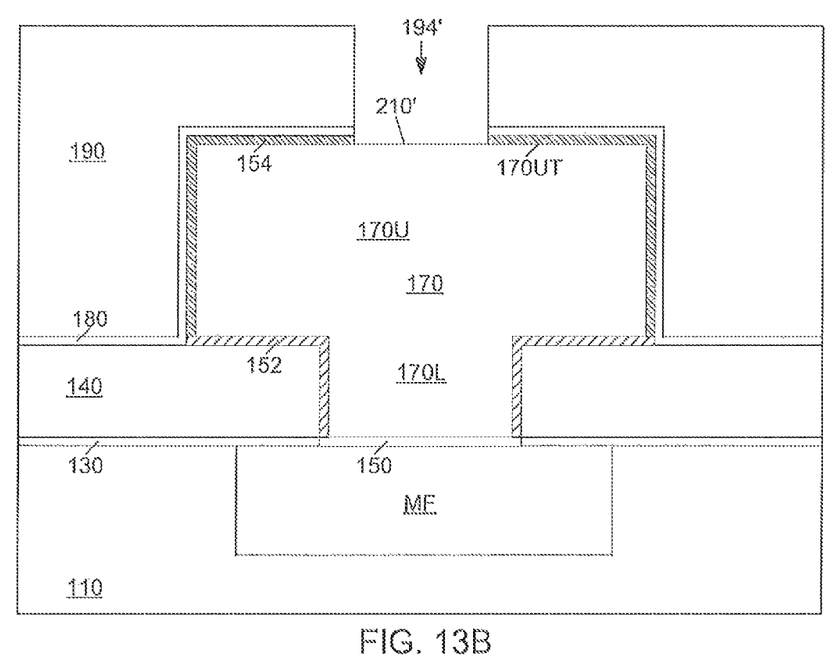

FIG. 13B shows another embodiment. In this embodiment, the opening 194 is extended to form the opening 194' which exposes a top surface 170UT of the fill layer 170. The embodiment shown in FIG. 13B may be used when the layer 154 is conductive as well as when the layer 154 is non-conductive. The opening 194' may expose a top surface 170UT of the fill layer 170 to as to form a bond pad surface 210'.

It is noted that the fill layer 170 may represent a conductive interconnect. The conductive interconnect may be for a semiconductor structure and/or device. In an embodiment, the conductive interconnect may be a structure formed by pattern plating. The conductive interconnect may be a conductive pad (for example, a bond pad) for a semiconductor structure and/or device. A conductive pad may, for example, be a bond pad. The bond pad may, for example, allow for electrical communication outside the semiconductor structure.

Figure 14:
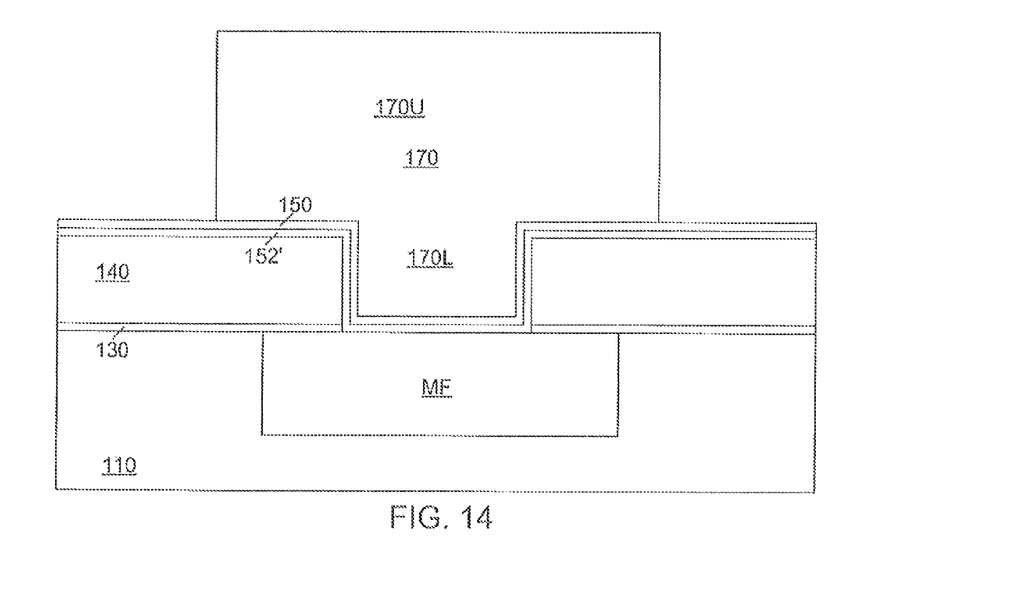
FIGS. 14 through 15 show a method of making a semiconductor structure.
Figure 15:
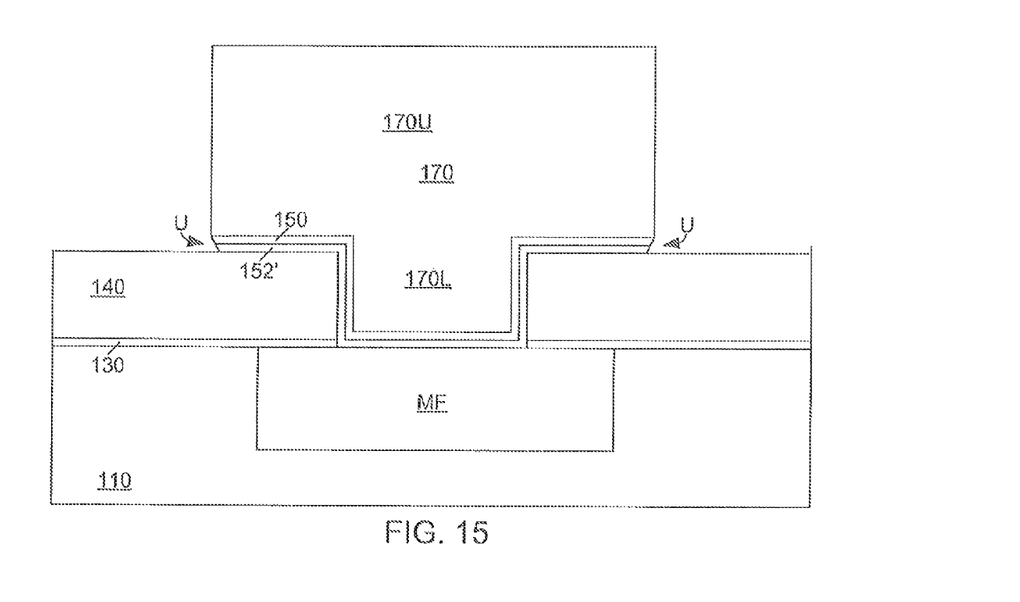

FIGS. 14 and 15 show an alternate process of making a conductive interconnect structure. Referring to FIG. 14, it is seen that a barrier layer 152' may be deposited over the dielectric layer 140. A seed layer 150 may then be deposited over the barrier layer 152'. A fill layer 170 may be formed over the seed layer 150. Referring to FIG. 15, that portion of the barrier layer 152' that does not underlie the fill layer 170 may be removed by an etching process such as a wet etching process. As a result of the wet etching process, an undercut U may be formed under the fill layer 170. Hence, a conductive interconnect (e.g. a bond pad) structure having an undercut may be formed.

The formation of a barrier layer 152 (for example, a self-formed barrier layer) as described by the embodiments depicted in FIGS. 1 through 13 forms the barrier layer 152 between the fill layer 170 and the dielectric layer 140. The formation of barrier layer material may thus be avoided over other portions of the top surface of the dielectric layer 140. Hence, there may be no need to remove barrier layer material from the top surface of other portions of the dielectric layer 140 by, for example, a wet etching process (as shown, for example, in FIG. 15). This may avoid the formation of an undercut under the upper portion of 170U of the fill layer 170 that may be created as a result of the etch of the barrier layer.

It is understood that embodiments presented herein may be combined with other embodiments to provide still further embodiments.

One or more embodiments relate to method for making a semiconductor structure, the method comprising: forming a first opening in a dielectric layer; forming a seed layer within the first opening; forming a masking layer over the seed layer; patterning the masking layer to form a second opening over the first opening; forming a fill layer over the seed layer; and causing the seed layer to react with the dielectric layer to form a barrier layer.

One or more embodiments relate to a method for making a semiconductor structure, the method comprising: forming an opening in a dielectric layer; forming a seed layer within the opening; forming a masking layer over the seed layer; patterning the masking layer to expose the seed layer in the opening; forming a fill layer over the exposed seed layer; and causing the seed layer to react with the dielectric layer to form a barrier layer.

One or more embodiments relate to a method of making a semiconductor structure, comprising: forming a seed layer in direct contact with a dielectric material; forming a masking layer over the seed layer; patterning the masking layer to expose the seed layer; forming a fill layer over the exposed seed layer; and causing the seed layer to react with the dielectric layer to form a barrier layer between the fill layer and the dielectric layer.

One or more embodiments relate to a semiconductor structure, comprising: a conductive layer having a lower portion and an upper portion, the lower portion having a bottom surface and a sidewall surface, the upper portion having a bottom surface, a sidewall surface and a top surface; and a first layer, the first layer disposed on a bottom surface of the upper portion of the conductive layer and a sidewall surface of the lower portion of the conductive layer, substantially none of the first layer being formed on the sidewall or top surfaces of the upper portion of the conductive layer, the first layer comprising a compound including a metallic element, O and S.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for making a semiconductor structure, the method comprising:
   forming a first opening in a dielectric layer;
   forming a seed layer within said first opening;
   forming a masking layer over said seed layer;
   patterning said masking layer to form a second opening over said first opening;
   forming a fill layer over said seed layer;
   removing said masking layer to expose said seed layer;
   removing said exposed seed layer and
   after removing said exposed seed layer, causing said seed layer to react with said dielectric layer to form a barrier layer between said seed layer and said dielectric layer, said barrier layer being in direct contact with said seed layer and said dielectric layer.

2. The method of claim 1, further comprising, after forming said fill layer, removing said patterned masking layer.

3. The method of claim 2, further comprising, after removing said patterned masking layer, removing that portion of the seed layer uncovered by removing said patterned masking layer.

4. The method of claim 1, wherein said seed layer comprises a base element and an additional element, said causing said seed layer to react causes said additional element to react with said dielectric layer.

5. The method of claim 4, wherein said additional element is an element selected from the group consisting of Mn, Mg, Al, Ti, V, Cr, Sn, Zn, Fe, and Ag.

6. The method of claim 4, wherein said additional element is selected from the group consisting of Mn, Fe, and Ag.

7. The method of claim 4, wherein said additional element is Mn.

8. The method of claim 4, wherein said base element is Cu.

9. The method of claim 4, wherein the atomic percent of said additional element is less than or equal to 10 atomic percent.

10. The method of claim 1, wherein said conductive structure is a bond pad.

11. The method of claim 1, wherein said masking layer comprises a photoresist layer.

12. The method of claim 4, wherein said seed layer comprises an alloy, said alloy comprising said base element and said additional element.

13. A method for making a semiconductor structure, the method comprising:
forming an opening in a dielectric layer;
forming a seed layer within said opening;
forming a masking layer over said seed layer;
patterning said masking layer to expose said seed layer in said opening;
forming a fill layer over said exposed seed layer;
removing said masking layer to uncover said seed layer;
removing said uncovered seed layer; and
after removing said uncovered seed layer, causing said seed layer to react with the dielectric layer to form a barrier layer between said seed layer and said dielectric layer, said barrier layer being in direct contact with said seed layer and said dielectric layer.

14. The method of claim 13, further comprising, after forming said fill layer, removing said masking layer.

15. The method of claim 13, further comprising, after removing said masking layer, removing that portion of the seed layer uncovered by removing said masking layer.

16. The method of claim 13, wherein seed layer comprises a base element and an additional element, said causing said seed layer to react causing said additional element to react with said dielectric layer.

17. The method of claim 16, wherein said additional element is an element selected from the group consisting of Mn, Mg, Al, Ti, V, Cr, Sn, Zn, Fe, and Ag.

18. The method of claim 16, wherein said additional element is selected from the group consisting of Mn, Fe, and Ag.

19. The method of claim 16, wherein said additional element is Mn.

20. The method of claim 16, wherein said base element is Cu.

21. The method of claim 15, wherein the atomic percent of said additional element is less than or equal to 10 atomic percent.

22. The method of claim 13, wherein said fill layer forms a bond pad.

23. The method of claim 13, wherein said masking layer comprises a resist layer.

24. A method of making a semiconductor structure, comprising:
forming a seed layer in direct contact with a dielectric material;
forming a masking layer over said seed layer;
patterning said masking layer to expose said seed layer;
forming a fill layer over said exposed seed layer;
removing said masking layer to uncover said seed layer;
remooving said uncovered seed layer; and
after removing said uncovered seed layer, causing said seed layer to react with said dielectric material to form a barrier layer between said seed layer and said dielectric material, said barrier layer being in direct contact with said seed layer and said dielectric material.

25. The method of claim 24, wherein before said causing said seed layer to react, removing said patterned masking layer.

26. The method of claim 25, wherein after removing said patterned masking layer but before causing said seed layer to react, removing that portion of the seed layer uncovered by removing said patterned masking layer.

27. The structure of claim 25, said causing said seed layer to react comprises a thermal anneal.

28. The structure of claim 25, wherein said forming said fill layer comprises an electrodeposition process.

29. The structure of claim 25, further comprising forming an opening in said dielectric material before forming said seed layer, said exposed seed layer being within said opening.

30. The method of claim 24, wherein said seed layer comprises a base element and an additional element, said base element being a first metallic element, said additional element being a second metallic element different from said first metallic element.

31. The method of claim 30, wherein said causing said seed layer to react includes causing said additional element to react with said dielectric layer.

32. The method of claim 30, wherein said base element is Cu and said additional element is an element selected from the group consisting of Mn, Mg, Al, Ti, V, Cr, Sn, Zn, Fe, and Ag.

33. The method of claim 30, wherein said seed layer comprises an alloy, said alloy include said base element and said additional element, said base element being a first metallic element, said additional element being an element selected from the group consisting of Mn, Mg, Al, Ti, V, Cr, Sn, Zn, Fe, and Ag.

34. The method of claim 24, wherein said dielectric layer comprises silicon dioxide.

35. The method of claim 1, wherein said barrier layer is disposed in said first opening.

36. The method of claim 13, wherein said barrier layer is disposed in direct contact with a sidewall surface of said dielectric layer.

37. The method of claim 1, wherein said causing said seed layer to react comprises an anneal process.

38. The method of claim 13, wherein said causing said seed layer to react comprises an anneal process.

* * * * *